US010983163B1

(12) United States Patent
Zhao

(10) Patent No.: US 10,983,163 B1
(45) Date of Patent: Apr. 20, 2021

(54) FUNCTION VERIFICATION SYSTEM FOR BOUNDARY SCAN TEST CONTROLLER AND METHOD THEREOF

(71) Applicants: Inventec (Pudong) Technology Corporation, Shanghai (CN); Inventec Corporation, Taipei (TW)

(72) Inventor: Jin-Dong Zhao, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/721,732

(22) Filed: Dec. 19, 2019

(30) Foreign Application Priority Data

Nov. 29, 2019 (CN) .......................... 201911207071.8

(51) Int. Cl.
*G01R 31/3177* (2006.01)
*G01R 31/317* (2006.01)
*G06F 13/42* (2006.01)

(52) U.S. Cl.
CPC ... *G01R 31/3177* (2013.01); *G01R 31/31718* (2013.01); *G06F 13/4282* (2013.01); *G06F 2213/0042* (2013.01)

(58) Field of Classification Search
CPC ................................................. G01R 31/3177
USPC .................. 714/727, 725, 729, 730, 724
See application file for complete search history.

(56) References Cited

U.S. PATENT DOCUMENTS

| | | | | | |
|---|---|---|---|---|---|
| 6,134,707 | A | * | 10/2000 | Herrmann | G06F 30/34 717/139 |
| 6,760,866 | B2 | * | 7/2004 | Swoboda | G06F 9/3005 713/601 |
| 6,931,344 | B2 | * | 8/2005 | Gotoh | G01R 31/31713 702/117 |
| 7,598,726 | B1 | * | 10/2009 | Tabatabaei | G01R 31/318572 324/756.07 |
| 2002/0013918 | A1 | * | 1/2002 | Swoboda | G06F 11/261 714/30 |
| 2005/0050393 | A1 | * | 3/2005 | Chakraborty | G01R 31/318541 714/30 |
| 2007/0011522 | A1 | * | 1/2007 | Denniston | G01R 31/318544 714/724 |

(Continued)

*Primary Examiner* — Fritz Alphonse
(74) *Attorney, Agent, or Firm* — David R. Stevens; Stevens Law Group

(57) ABSTRACT

A function verification method for a boundary scan test controller is disclosed. In the method, the configuration positions of input/output connectors on a test board correspond to configuration positions of to-be-verified connectors on a boundary scan test controller, so that when the test board is stacked and positioned on the boundary scan test controller, the input/output connectors can be electrically connected to the to-be-verified connectors corresponding thereto, respectively. After being electrically connected to the boundary scan test controller via a USB port, the test control host creates a test script according to information of the test board and all operations of the to-be-verified connectors, and then execute a test program in the to-be-verified connectors according to the test script, and generates a test report, and determines whether the boundary scan test controller meets shipment or production requirement according to the test report.

8 Claims, 2 Drawing Sheets

(56) References Cited

U.S. PATENT DOCUMENTS

2009/0113264 A1* 4/2009 Seibold .......... G01R 31/318544
714/727
2009/0164856 A1* 6/2009 Seibold ................. G06F 11/267
714/718
2014/0149815 A1* 5/2014 Sun ........................ G11C 29/32
714/727

* cited by examiner

FUNCTION VERIFICATION SYSTEM FOR BOUNDARY SCAN TEST CONTROLLER AND METHOD THEREOF

CROSS-REFERENCE TO RELATED APPLICATION

This application claims the benefit of Chinese Application Serial No. 201911207071.8, filed Nov. 29, 2019, which is hereby incorporated herein by reference in its entirety.

BACKGROUND OF THE INVENTION

1. Field of the Invention

The present invention relates to a function verification system and a method thereof, and more particularly to a function verification system for a boundary scan test controller, and a method thereof.

2. Description of the Related Art

The conventional function verification method for a boundary scan test controller is usually to directly connect the boundary scan test controller to a hardware platform built in the environment of actual production, and use data of the hardware platform to create a test script, and then determine whether the functions of the boundary scan test controller are normal according to test results obtained after the test script is executed. The above-mentioned conventional method can verify the resources of the boundary scan controller used by the hardware platform, but there still is a problem that it is hard to confirm whether all the resources of the boundary scan controller are good in the same environment.

Furthermore, after batch production of the boundary scan test controllers, there is a lack of a convenient hardware tool for functional verification before shipment. Furthermore, during the on-site maintenance of the production line, it is necessary to replace the boundary scan test controller on the machine and perform related tests to confirm the working status of the to-be-tested board. When the boundary scan test controller is defective, the defective boundary scan test controller must be disassembled from the machine and replaced by a normal boundary scan test controller, and it causes low maintenance efficiency.

Therefore, how to design a function verification solution dedicated to the boundary scan test controller to solve the conventional technical problem that all resources of the boundary scan controller cannot be confirmed in the same environment, and the problem of the lack of the convenient hardware tool for verifying functions of the boundary scan test controller before shipment and the problem of low maintenance efficiency of the on-site maintenance for production line due to the operation of detaching and replacing the defective boundary scan test controller, is a key issue in the industries.

SUMMARY OF THE INVENTION

An objective of the present invention is to provide a function verification system for a boundary scan test controller, and a method thereof, in order to solve the above-mentioned problems.

In order to achieve the objective, the present invention discloses a function verification system for a boundary scan test controller. The function verification system is applied to execute a test program in a boundary scan test controller which comprises a USB port and a plurality of to-be-verified connectors, and the function verification system includes a test board and a test control host. The test board includes a plurality of input/output connectors corresponding to the plurality of to-be-verified connectors one by one. The configuration positions of the plurality of input/output connectors on the test board correspond to the configuration positions of the plurality of to-be-verified connectors on the boundary scan test controller, so that when the test board is stacked and positioned on the boundary scan test controller, the plurality of input/output connectors are electrically connected to the plurality of to-be-verified connectors corresponding thereto, respectively. The test control host is electrically connected to the boundary scan test controller via the USB port, and configured to create a test script according to information of the test board and all operations of the plurality of to-be-verified connectors, and execute the test program in the plurality of to-be-verified connectors according to the test script, and generate a test report, and determine whether the boundary scan test controller meets shipment or production requirement according to the test report.

In order to achieve the objective, the present invention discloses a function verification method for a boundary scan test controller. The function verification method includes following steps: providing a test control host, a boundary scan test controller, and a test board, wherein the boundary scan test controller comprises a USB port and a plurality of to-be-verified connectors, the test board comprises a plurality of input/output connectors corresponding to the plurality of to-be-verified connectors one by one, and the configuration positions of the plurality of input/output connectors on the test board correspond to the configuration positions of the plurality of to-be-verified connectors on the boundary scan test controller; electrically connecting the test control host to the boundary scan test controller via the USB port; stacking and positioning the test board on the boundary scan test controller, to electrically connect the plurality of input/output connectors to the plurality of to-be-verified connectors corresponding thereto, respectively; creating, by the test control host, a test script according to information of the test board and all operations of the to-be-verified connectors; executing, by the test control host, a test program in the plurality of to-be-verified connectors according to the test script, and generating a test report; and determining, by the test control host, whether the boundary scan test controller meets shipment or production requirement, according to the test report.

According to the system and method of the present invention, the difference between the conventional technology and the system and method of the present invention is that, in the present invention, the configuration positions of the plurality of input/output connectors on the test board correspond the configuration positions of the plurality of to-be-verified connectors on the boundary scan test controller, so that the test board can be stacked and positioned on the boundary scan test controller, and the plurality of input/output connectors can be electrically connected to the plurality of to-be-verified connectors corresponding thereto, respectively; after the test control host is electrically connected to the boundary scan test controller via the USB port, the test script can be created according to the information of the test board and all operations of the to-be-verified connectors, and the test program is executed in the to-be-verified connectors according to the test script, so as to generate the test report, and it can determine whether the boundary scan test controller meets shipment or production requirement according to the test report.

By using the aforementioned technical solution, the present invention can provide individual verification design for the boundary scan test controller, lay the hardware verification foundation for the functions supported by the boundary scan test controller, so as to check all resource conditions of the boundary scan test controller; furthermore, the test board is connected to the boundary scan test controller, so that it is convenient in deployment without using additional apparatus; the solution of the present invention can perform verification before shipment of the boundary scan test controller, to verify the boundary scan test controller before shipment and check the condition of the boundary scan test controller, so that the boundary scan test controller with normal condition can be mounted on the production-line machine, to prevent the debug operation of the machine from being affected by an uncertain factor due to replacement of the boundary scan test controller, thereby effectively reducing rework.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
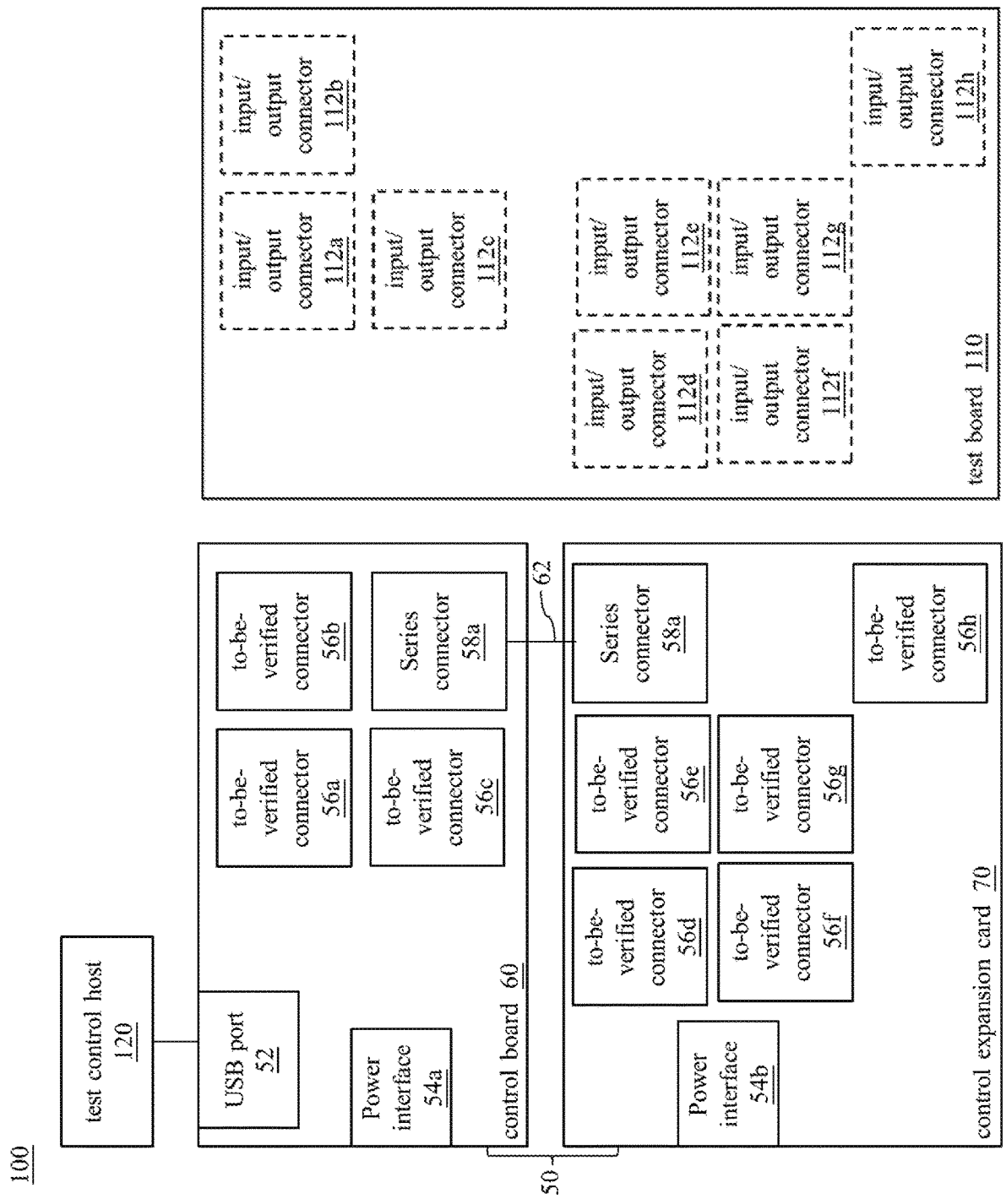
FIG. 1 is a system block diagram of an embodiment of a function verification system for a boundary scan test controller of the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise", "include" and "have", and variations such as "comprises", "comprising", "includes", "including", "has" and "having" will be acknowledged to imply the inclusion of stated elements but not the exclusion of any other elements.

Please refer to FIG. 1, which is a system block diagram of an embodiment of a function verification system for a boundary scan test controller of the present invention. In this embodiment, the function verification system 100 executes a test program in the boundary scan test controller 50. In an embodiment, the boundary scan test controller 50 can be formed by serially connecting a control board 60 and a controller expansion card 70; however, the present invention is not limited to the above-mentioned example, and in other words, the actual boundary scan test controller 50 can be formed by a single control board, by two control boards connected to a test control host 120, or formed by a control board and one controller expansion card or two controller expansion cards, and the manner of forming the actual boundary scan test controller 50 can be adjusted according to practical demand.

In this embodiment, the boundary scan test controller 50 can comprise a USB port 52, a power interface 54a, a power interface 54b, and a plurality of to-be-verified connectors which include a to-be-verified connector 56a, a to-be-verified connector 56b, a to-be-verified connector 56c, a to-be-verified connector 56d, a to-be-verified connector 56e, a to-be-verified connector 56f, a to-be-verified connector 56g and a to-be-verified connector 56h. The control board 60 can comprise the USB port 52, the power interface 54a, the to-be-verified connector 56a, the to-be-verified connector 56b, the to-be-verified connector 56c and the series connector 58a. The controller expansion card 70 can comprise the power interface 54b, the to-be-verified connector 56d, the to-be-verified connector 56e, the to-be-verified connector 56f, the to-be-verified connector 56g, the to-be-verified connector 56h and the series connector 58b. The series connector 58a of the control board 60 is electrically connected to the series connector 58b of the controller expansion card 70, that is, the control board 60 is interconnected with the controller expansion card 70 via the connection line 62, so as to form the boundary scan test controller 50. It should be noted that the number of the to-be-verified connectors actually included in the control board 60 and the number of the to-be-verified connectors actually included in the controller expansion card 70 can be adjusted according to practical demand.

Furthermore, in this embodiment, the to-be-verified connector 56a can be a to-be-verified connector and the series connector 58a is a connector connected to the controller expansion card 70; however, the present invention is not limited to the above-mentioned example, and in other implementations, the to-be-verified connector 56a can be used as the connector connected to the controller expansion card, and the series connector 58a can be used as the to-be-verified connector. In other words, the to-be-verified connector 56a and the series connector 58a has two functions, one function is to serve as a to-be-verified connector, and the other function is to serve as the connector connected to the controller expansion card, and their functions can be adjusted or exchanged according to practical demand. Furthermore, in this embodiment, the to-be-verified connector 56d, the to-be-verified connector 56e, the to-be-verified connector 56f, the to-be-verified connector 56g and the to-be-verified connector 56h included in the controller expansion card 70, can have partial functions of the to-beverified connector 56a, the to-be-verified connector 56b and the to-be-verified connector 56c included in the controller board; however, the present invention is not limited to the above-mentioned example, and the above-mentioned configurations can be adjusted according to practical demand.

It should be noted that the USB port 52 is an interface electrically connected between the boundary scan test controller 50 and an external component, for example, in this embodiment, the external component is the test control host 120, so the power interface 54a and the power interface 54b can be used as interfaces for the boundary scan test controller 50 to obtain electrical power to execute other functions. Therefore, before the function verification of the present invention is performed on the boundary scan test controller, the USB port 52, the power interface 54a and power interface 54b must be in good working statuses, and it is not necessary to particularly design the USB port 52, the power interface 54a and the power interface 54b additionally.

In this embodiment, the function verification system 100 comprises a test board 110 and a test control host 120. The test control host 120 can be a general computer, a notebook computer, etc., but these examples are merely for exemplary illustration, and the application field of the present invention is not limited thereto.

The size of the test board 110 can be substantially similar to or smaller than that of the boundary scan test controller 50, and the test board 110 can comprise a plurality of input/output connectors which include, for example, an input/output connector 112a, an input/output connector 112b, an input/output connector 112c, an input/output connector 112d, an input/output connector 112e, an input/output connector 112f, an input/output connector 112g, and an input/output connector 112h. The plurality of input/output connectors correspond to the plurality of to-be-verified connectors one by one. For example, in this embodiment, the input/output connector 112a corresponds to the to-be-verified connector 56a, the input/output connector 112b corresponds to the to-be-verified connector 56b, the input/output connector 112c corresponds to the to-be-verified connector 56c, the input/output connector 112d corresponds to the to-be-verified connector 56d, the input/output connector 112e corresponds to the to-be-verified connector 56e, the input/output connector 112f corresponds to the to-be-verified connector 56f, the input/output connector 112g corresponds to the to-be-verified connector 56g, and the input/output connector 112h corresponds to the to-be-verified connector 56h. The configuration positions of the plurality of input/output connectors on the test board 110 correspond to the configuration positions of the plurality of to-be-verified connectors on the boundary scan test controller 50, so that when the test board 110 is stacked and positioned on the boundary scan test controller 50, the plurality of input/output connectors can be electrically connected to the plurality of to-be-verified connectors corresponding thereto, respectively. The test board 110 is positioned and stacked on the boundary scan test controller 50 via the plurality of input/output connectors.

In other words, the size of each input/output connector is substantially the same as that of the to-be-verified connector corresponding thereto, and the relative position of one input/output connector relative to other input/output connectors on the test board 110 is the same as the relative position of the to-be-verified connector corresponding to the one input/output connector relative to the to-be-verified connectors corresponding to the other input/output connectors on the boundary scan test controller 50, as shown in FIG. 1. It should be noted that the plurality of input/output connectors are disposed on a lower part of FIG. 1 and drawn by dashed line blocks.

In this embodiment, the test control host 120 can be electrically connected to the boundary scan test controller 50 via the USB port 52, and can create a test script according to information of the test board 110 and all operations of the to-be-verified connectors. The information of the test board 110 includes the circuit design of the test board 110 and chips used in the test board 110. The circuit design of the test board 110 must satisfy the operations of checking functions of the to-be-verified connectors to be complete, and can be used to simulate a target board of the original boundary scan test, for example, the target board can be the motherboard used to perform boundary scan test on the boundary scan test controller 50 in production line. The all operations of the plurality of to-be-verified connectors include operations of ground (GND) pins, power pins, output pins, test data input (TDI) pins, test data output (TDO) pins, test clock input (TCK) pins, test mode select input (TMS) pins, test reset (TRST) pins and analog signal input (AD_In) pins.

The test control host 120 can execute a test program in the to-be-verified connectors according to the test script, and generate a test report. The test program comprises following steps; transmitting, by the test control host 120, corresponding test instruction and test data to the boundary scan test controller 50 according to the test script; converting, by the boundary scan test controller 50, the test data and the test instruction into a JTAG signal and then transmitting the JTAG signal to the test board 110, and transmitting, by the boundary scan test controller 50, response data of the test board 110 to the test control host 120, and generating, by the test control host 120, the test report according to the response data.

The test control host 120 can determine, according to the test report, whether the boundary scan test controller 50 meets shipment or production requirement. In other words, since the test control host 120 creates the test script according to information of the test board 110 and all operations of the to-be-verified connectors, the test report generated after the test script is executed can be used to check whether the functions of each to-be-verified connector are complete, so as to ensure that the boundary scan test controller 50 can meet shipment requirement and the usage scenario during manufacturing and verification. In order to check whether the functions of the to-be-verified connectors are complete, the test script must include a plurality of test items, and the test report includes the test results of the plurality of test items. When the test control host 120 determines that the test results of the test report pass the test, the test control host 120 determines that the boundary scan test controller 50 meets shipment or production requirement; in other words, as long as one of the test results of the test item fails or is abnormal, the test control host 120 determines that the boundary scan test controller 50 does not meet shipment or production requirement.

In this embodiment, the test items contained in the test script include function tests for the GND pins, the power pins, the output pins, the TDI pins, the TDO pins, the TCK pins, the TMS pins, the TRST pins and the AD_In pins of the to-be-verified connectors.

In greater detail, the test process for a power pin of the to-be-verified connector includes following steps: reading, by the test control host 120, a voltage value of the power pin during the test process; and when detecting that the voltage value of the power pin of the to-be-verified connector is within an allowable error range, determining, by the test control host 120, that the power pin of the to-be-verified connector passes the test, wherein the test control host 120 has a preset voltage value of the power pin and its allowable error range before the test is performed. Furthermore, the test process for a GND pin of the to-be-verified connector includes following steps: during the test process, under the premise of safety assurance, inputting, by the test control host 120, a certain current into the GND pin of the to-be-verified connector; obtaining, by the test board 110, a working status of the GND pin and transmitting the working status to the test control host 120 through the boundary scan test controller 50 (that is, the response data of the test board 110 includes the working statuses of the GND pins of the to-be-verified connector); and when detecting that the working status of the GND pin of the to-be-verified connector is low continuously, determining, by the test control host 120, that the GND pin of the to-be-verified connector is short-circuit, which indicates that the GND pin of the to-be-verified connector passes the test. The test process for an AD_In pin of the to-be-verified connector includes following steps: during the test process, reading, by the test board 110, a voltage value of the AD_In pin and transmitting the voltage value to the test control host 120 through the boundary scan test controller 50 (that is, the response data includes the voltage value of the AD_In pin of the to-be-verified connector); and when detecting that the voltage value of the AD_In pin of the to-be-verified connector is within an allowable error range, determining, by the test control host 120, that the AD_In pin of the to-be-verified connector pass the test, wherein the test control host 120 has a preset voltage value of the AD_In pin and its allowable error range before the test is performed. The test process for an output pin and/or an TRST pin of the to-be-verified connector includes following steps: during the test process, controlling, by the test control host 120, logic level(s) of the output pin and/or the TRST pin of the to-be-verified connector; obtaining, by the test board 110, working status(es) (that is, being logic high level or logic low level) of the output pin and/or the pin TRST, and transmitting the working status(es) to the test control host 120 through the boundary scan test controller 50 (that is, the response data includes the working status(es) of the output pin and/or the TRST pin of the to-be-verified connector); and when detecting that the working status(es) of the output pin and/or the TRST pin of the to-be-verified connector are/is the same as the logic level(s) of the output pin and/or the TRST pin of the to-be-verified connector controlled by the test control host 120, determining, by the test control host 120, that the output pin and/or the TRST pin of the to-be-verified connector pass(es) the test. The test process for a TDI, a TDO pin, a TCK pin and/or a TMS pin of the to-be-verified connector includes following steps: during the test process, performing a boundary scan method, by the test control host 120, to read an IDCODE-value of the chip of the test board 110, or pushing a SAMPLE command to sample input/output data of the chip of the test board 110; and when the IDCODE-value read by the test control host 120 or the data sampled by the test control host 120 being in line with expectation, determining, by the test control host 120, that the TDI pin, the TDO pin, the TCK pin and/or the TMS pin of the to-be-verified connector pass(es) the test.

Figure 2:
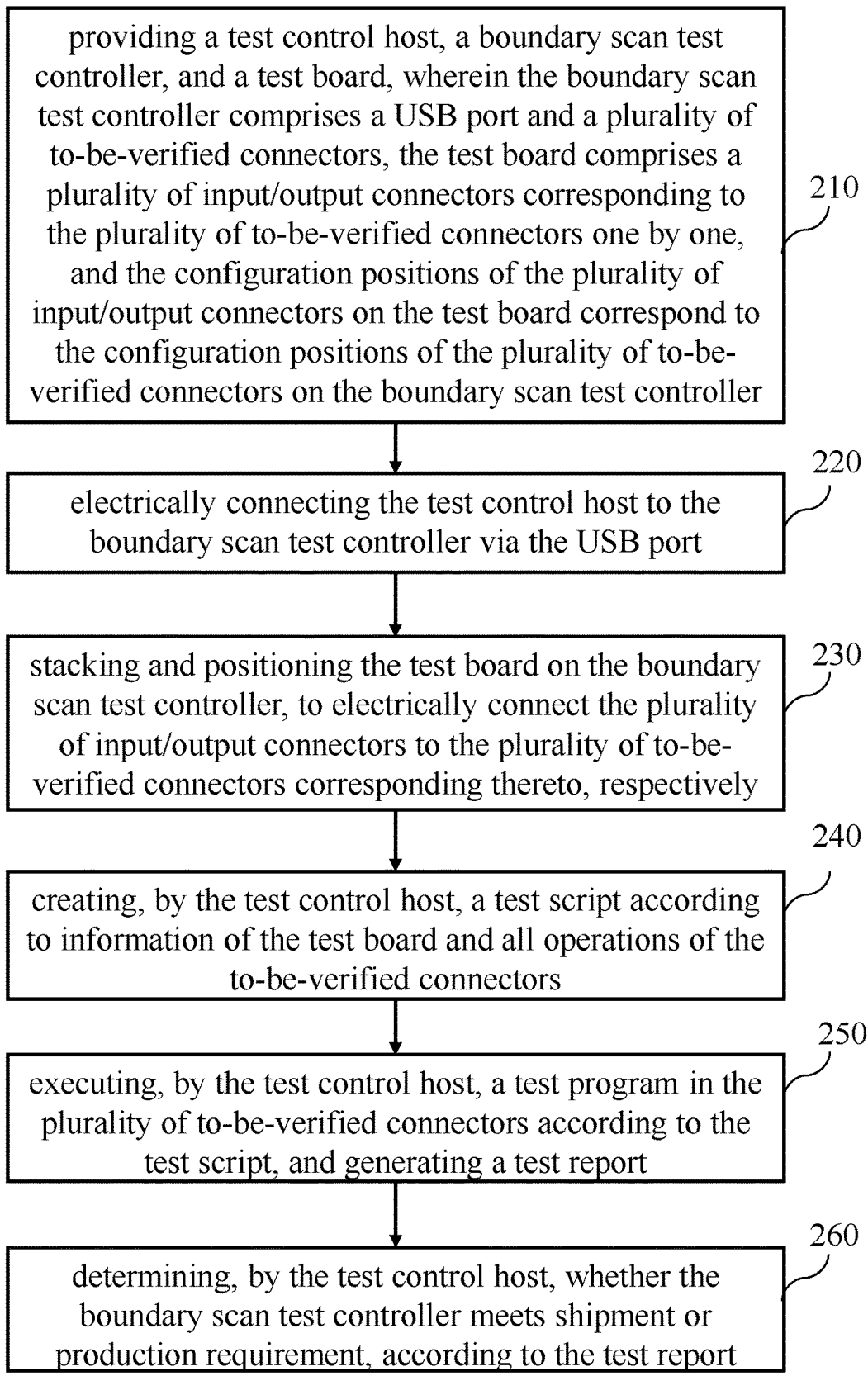
FIG. 2 is a flowchart of an embodiment of a function verification method for the boundary scan test controller performed by the function verification system of FIG. 1.

Please refer to FIG. 2, which is a flowchart of an embodiment of a function verification method for the boundary scan test controller performed by the function verification system of FIG. 1. The function verification method includes steps 210 to 260. In the step 210, the test control host, the boundary scan test controller and the test board are provided, and the boundary scan test controller comprises the USB port and the plurality of to-be-verified connectors, the test board comprises a plurality of input/output connectors corresponding to the plurality of to-be-verified connectors one by one, and the configuration positions of the plurality of input/output connector on the test board correspond to the configuration positions of the to-be-verified connectors on the boundary scan test controller. In the step 220, the test control host is electrically connected to the boundary scan test controller via the USB port. In the step 230, the test board is stacked and positioned on the boundary scan test controller, so that the plurality of input/output connectors are electrically connected to the plurality of to-be-verified connectors corresponding thereto. In the step 240, the test control host creates the test script according to information of the test board and all operations of the to-be-verified connectors. In the step 250, the test control host executes the test program in the to-be-verified connectors according to the test script, and generates the test report. In the step 260, the test control host determines whether the boundary scan test controller meets shipment or production requirement according to the test report.

In this embodiment, all operations of the to-be-verified connectors described in the step 240, include operations of the GND pins, the power pins, the output pins, the TDI pins, the TDO pins, the TCK pins, the TMS pins, the TRST pins and the AD_In pins.

In this embodiment, the test program of step 250 includes following steps. First, the test control host transmits the corresponding test instruction and the test data to the boundary scan test controller, according to the test script. Next, the boundary scan test controller converts the test data and the test instruction into the JTAG signal, and transmits the JTAG signal to the test board. Next, the response data of the test board is transmitted by the boundary scan test controller to the test control host. Finally, the test control host generates the test report according to the response data.

In this embodiment, the step 260 can further include following step. When the test control host determines that all the test results of the test report pass test, the test control host determines that the boundary scan test controller meets shipment or production requirement.

It should be noted that the steps of the aforementioned function verification method for the boundary scan test controller can be executed in any sequence, unless the cause-effect relation specifically indicated herein.

According to above-mentioned contents, the difference between the present invention and the conventional technology is that the configuration positions of the plurality of input/output connectors on the test board correspond to the configuration positions of the plurality of to-be-verified connectors on the boundary scan test controller, so that when the test board is stacked and positioned on the boundary scan test controller, the plurality of input/output connectors can be electrically connected to the to-be-verified connectors corresponding thereto; after the test control host is electrically connected to the boundary scan test controller via the USB port, the test control host can create the test script according to the information of the test board and the all operations of the to-be-verified connectors, and then execute the test program in the to-be-verified connectors according to the test script, and generate the test report and then determine whether the boundary scan test controller meets shipment or production requirement according to the test report. By the technical solution, the present invention can provide individual verification design for the boundary scan test controller to lay the hardware verification foundation for the functions supported by the boundary scan test controller, and also can check all resource conditions of the boundary scan test controller; furthermore, the test board is connected to the boundary scan test controller, so that it is convenient in deployment without using additional apparatus; function verification of the boundary scan test controller can be performed before shipment; the boundary scan test controller can be verified before shipment, to check the conditions of the boundary scan test controller, so that the boundary scan test controller being checked to have good condition can be mounted on the production-line machine, thereby preventing the debug operation of the machine from being affected by the uncertain factor due to replacement of the boundary scan test controller, and effectively reducing rework.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A function verification system for a boundary scan test controller, applied to execute a test program in a boundary scan test controller which comprises a USB port and a plurality of to-be-verified connectors, and the function verification system comprising:
   a test board comprising a plurality of input/output connectors corresponding to the plurality of to-be-verified connectors one by one, wherein the configuration positions of the plurality of input/output connectors on the test board correspond to the configuration positions of the plurality of to-be-verified connectors on the boundary scan test controller, so that when the test board is stacked and positioned on the boundary scan test controller, the plurality of input/output connectors are electrically connected to the plurality of to-be-verified connectors corresponding thereto, respectively; and
   a test control host electrically connected to the boundary scan test controller via the USB port, and configured to create a test script according to information of the test board and all operations of the plurality of to-be-verified connectors, and execute the test program in the plurality of to-be-verified connectors according to the test script, and generate a test report, and determine whether the boundary scan test controller meets shipment or production requirement according to the test report.

2. The function verification system according to claim 1, wherein the test program includes the following steps:
   transmitting, by the test control host, corresponding test instruction and test data to the boundary scan test controller according to the test script,
   converting, by the boundary scan test controller, the test data and the test instruction into a JTAG signal, and transmitting the JTAG signal to the test board, and transmitting response data of the test board to the test control host; and
   generating, by the test control host, the test report according to the response data.

3. The function verification system according to claim 1, wherein all operations of the plurality of to-be-verified connectors comprise operations of ground pins, power pins, output pins, test data input pins, test data output pins, test clock input pins, test mode select input pins, test reset pins and analog signal input pins.

4. The function verification system according to claim 1, wherein when the test control host determines that all test results of the test report pass test, the test control host determines that the boundary scan test controller meets shipment or production requirement.

5. A function verification method for a boundary scan test controller, comprising the following steps:
   providing a test control host, a boundary scan test controller, and a test board, wherein the boundary scan test controller comprises a USB port and a plurality of to-be-verified connectors, the test board comprises a plurality of input/output connectors corresponding to the plurality of to-be-verified connectors one by one, and the configuration positions of the plurality of input/output connectors on the test board correspond to the configuration positions of the plurality of to-be-verified connectors on the boundary scan test controller;
   electrically connecting the test control host to the boundary scan test controller via the USB port;
   stacking and positioning the test board on the boundary scan test controller, to electrically connect the plurality of input/output connectors to the plurality of to-be-verified connectors corresponding thereto, respectively;
   creating, by the test control host, a test script according to information of the test board and all operations of the to-be-verified connectors;
   executing, by the test control host, a test program in the plurality of to-be-verified connectors according to the test script, and generating a test report; and
   determining, by the test control host, whether the boundary scan test controller meets shipment or production requirement, according to the test report.

6. The function verification method according to claim 5, wherein the test program comprises the following steps:
   transmitting, by the test control host, corresponding test instruction and test data to the boundary scan test controller, according to the test script;
   converting, by the boundary scan test controller, the test data and the test instruction into a JTAG signal, and transmitting the JTAG signal to the test board, and transmitting response data of the test board to the test control host; and
   generating, by the test control host, a test report according to the response data.

7. The function verification method according to claim 5, wherein all operations of the plurality of to-be-verified connectors comprise operations of ground pins, power pins, output pins, test data input pins, test data output pins, test clock input pins, test mode select input pins, test reset pins and analog signal input pins.

8. The function verification method according to claim 5, wherein the step of determining, by the test control host, whether the boundary scan test controller meets shipment or production requirement according to the test report, further comprises:
   when the test control host determining that all test results of the test report pass test, determining, by the test control host, that the boundary scan test controller meets shipment or production requirement.

* * * * *